United States Patent [19]

Yarbrough et al.

[11] Patent Number: 5,021,687

[45] Date of Patent: Jun. 4, 1991

[54] HIGH SPEED INVERTING HYSTERESIS TTL BUFFER CIRCUIT

[75] Inventors: Roy Yarbrough, Hiram; Ernest D. Haacke, Scaraborough; Lars G. Jansson, Long Island, all of Me.

[73] Assignee: National Semiconductor Corporation, Santa Clara, Calif.

[21] Appl. No.: 473,533

[22] Filed: Feb. 1, 1990

[51] Int. Cl.⁵ .......................................... H03K 19/003
[52] U.S. Cl. ..................... 307/456; 307/290; 307/359
[58] Field of Search ............... 307/443, 454, 456, 458, 307/359, 290

[56] References Cited

U.S. PATENT DOCUMENTS

| | | | |
|---|---|---|---|
| 4,339,676 | 7/1982 | Ramsey | 307/456 X |
| 4,507,575 | 3/1985 | Mori et al. | 307/456 |
| 4,591,741 | 5/1986 | Cooper | 307/443 X |
| 4,806,787 | 2/1989 | Kato et al. | 307/290 |
| 4,883,975 | 11/1989 | Enomoto et al. | 307/290 |

FOREIGN PATENT DOCUMENTS

| | | | |
|---|---|---|---|
| 0162625 | 12/1980 | Japan | 307/290 |
| 0204626 | 12/1982 | Japan | 307/290 |
| 0129918 | 6/1986 | Japan | 307/456 |

OTHER PUBLICATIONS

Berger et al., "TTL Circuit with Improved Noise Margins", IBM T.D.B. vol. 19, No. 1, 6-1976, pp. 142-143.

Primary Examiner—David Hudspeth
Attorney, Agent, or Firm—Gail W. Woodward; Lee Patch; Michael A. Glenn

[57] ABSTRACT

A TTL inverter buffer circuit is provided with a switched current that produces hysteresis in the threshold values. The current is switched on by a control circuit when the input logic is low and off when the logic is high. The control circuit receives its sense from the logic state so that when the input logic is low a high threshold is created and when the input logic is high a low threshold is created. The difference is the circuit hysteresis voltage which is dependent upon the switched current and a resistor.

9 Claims, 2 Drawing Sheets

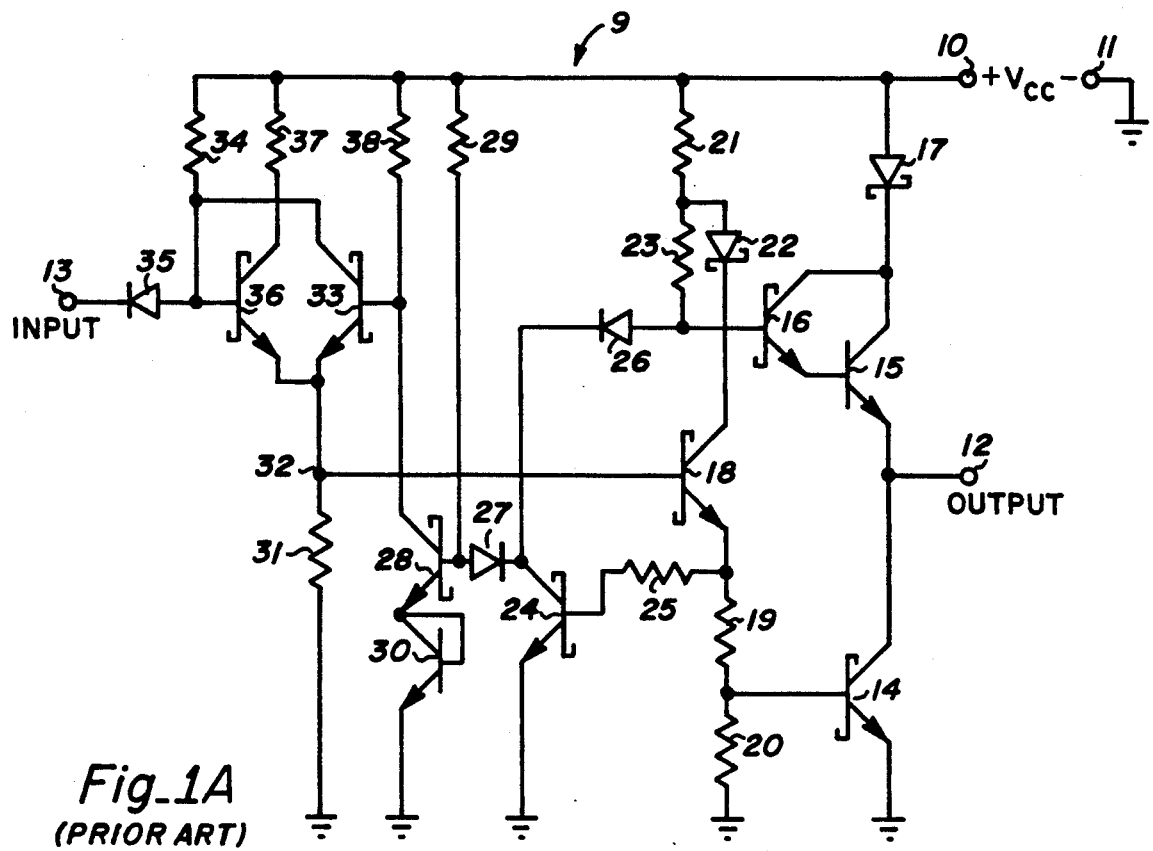
Fig_1A (PRIOR ART)
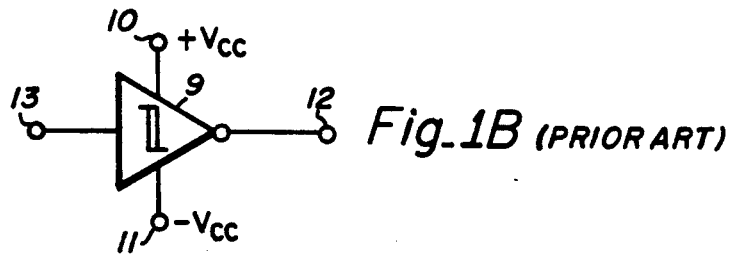
Fig_1B (PRIOR ART)
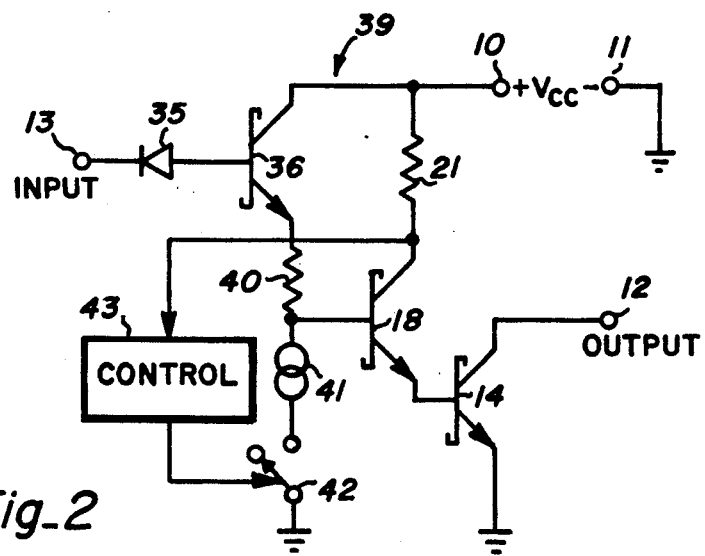
Fig_2

HIGH SPEED INVERTING HYSTERESIS TTL BUFFER CIRCUIT

BACKGROUND OF THE INVENTION

Transistor-transistor-logic (TTL) represents a widely used form of bipolar transistor circuit configurations. One of the latest and best known examples of this is the FAST ® family of integrated circuit (IC) devices. The acronym stands for Fairchild Advanced Schottky TTL. National Semiconductor Corporation has published a databook covering this family of IC devices. It is titled "FAST ® ADVANCED SCHOTTKY TTL LOGIC". The FAST ® IC devices are fabricated using the well-known Isoplanar II technology which can produce IC transistors with very high, well-controlled switching speeds, extremely small parasitic capacitances and $f_T$ in excess of 5GHz. These transistors can employ Schottky diode clamps to avoid the turn-on delays normally associated with bipolar transistor saturation. The teaching in the above-mentioned databook is incorporated herein by reference.

In the following discussion the symbol $\theta$ (the Greek symbol for phi) is employed to designate a voltage equal to the base emitter voltage of a conducting junction transistor or the forward bias developed by a conducting PN junction diode. It is to be understood that a Schottky diode will develop a forward bias that is a fraction of that of a PN junction, or about $\theta/2$, when conducting. Also, a Schottky diode clamped junction transistor will produce a minimum on voltage drop of slightly over $\theta/2$ which is referred to as the saturation voltage.

DESCRIPTION OF THE PRIOR ART

FIG. 1A shows a simplified prior art TTL inverter gate circuit 9 with hysteresis. FIG. 1B shows the logic diagram symbol for such a circuit. The schematic diagram of FIG. 1A is not complete. A number of circuit elements have been omitted for clarity. These omitted circuit elements include such items as tri-state ® control circuitry, transfer characteristic squaring elements and circuit node discharging and clamping elements.

The circuit 9 is operated from a $V_{CC}$ power supply connected + to terminal 10 and − to ground terminal 11. The logic signal at output terminal 12 is an inverted amplified version of the logic signal at input terminal 13. The various elements shown contribute to the circuit hysteresis in the following manner.

Transistor 14 is the conventional output stage pulldown Schottky transistor. Darlington connected transistors 15 and 16 along with diode 17, provide the output stage pullup elements. Transistors 14 and 16 are driven in paraphase by phase splitter switch transistor 18. Resistor 31 acts to discharge the base node 32 of transistor 18 when the input logic state is low.

Resistors 19 and 20 form a voltage divider that acts as the emitter load for phase splitter switch transistor 18 and operates to drive the base of transistor 14. Resistor 21, in conjunction with diode 22, returns the collector of transistor 18 to the +$V_{CC}$ rail. Resistor 23 couples the collector load of transistor 17 to the base of transistor 16. When transistor 18 is switched on its emitter will pull the base of transistor 14 up and turn it on. It will also turn transistor 24 on by way of resistor 25. Resistor 19 is of low value so as to develop only a relatively small negligible voltage drop and it operates in conjunction with resistor 25 to avoid current hogging between transistors 14 and 24. Resistor 21 is the collector load for transistor 18 which, when switched on, will pull the base of transistor 16 low thereby turning the pullup function off. Transistor 24, which has its collector coupled to the base of transistor 16 by means of diode 26, also acts to pull the base of transistor 16 low when turned on. In combination transistor 24 and diode 26 will act clamp the base of transistor 16 at a voltage level of $V_{SAT}+\theta$. This will ensure that the pullup function is off. Resistor 31 returns node 32 to ground. It can be seen that for the on conditions for transistors 14 and 18, circuit node 32 will be clamped at about 2$\theta$ above ground. In this logic input state output transistor 14 will sink current from any load (not shown) connected to terminal 12.

Diode 27 couples the collector of transistor 24 to the base of transistor 28 which is returned to +$V_{CC}$ by resistor 29. When transistor 24 is on, it will conduct to pull current through diode 27 and resistor 29. This action will clamp the base of transistor 28 at $V_{SAT}+\theta$ above ground. Since the combination of transistor 28 and CBS (collector-base-shorted) transistor 30 will have a conduction threshold of 2$\theta$, transistors 28 and 30 will be off. As a result, the current flowing in resistor 38 will pull the base of transistor 33 up thereby saturating it. Resistor 34 returns the collector of transistor 33 to the +$V_{CC}$ rail. Diode 35 returns the collector of transistor 33 to input terminal 13. Since diode 35 is forward biased to produce a voltage drop of $\theta$ an since node 32 is at 2$\theta$, when transistors 14 and 18 are on, the input terminal will have a threshold value of $\theta+V_{SAT33}$. Since a Schottky transistor $V_{SAT}$ is close to 0.5$\theta$ the threshold voltage will be close to 1.5$\theta$. This occurs because the $\theta$ of diode 35 will subtract from the 2$\theta$ threshold of node 32. Thus, when the input logic is high the input will have to drop below about 1.5$\theta$ in order to reach the switching transition threshold.

When the input logic state is low circuit node 32 will be held low, as will be described below, so that transistors 14, 18 and 24 will be off. This will also turn off diodes 22, 26 and 27. The current flowing in resistors 21 and 23 will pull the base of transistor 16 up thereby turning on the pullup function for the output terminal 12. For this circuit state it will source current to any load (not shown) connected to terminal 12.

For this logic state current flow in resistor 29 will pull the base of transistor 28 up and turn it on along with BCS transistor 30. This will clamp the base of transistor 33 at $\theta+V_{SAT28}$ so that it will be off. The current flowing in resistor 34 will pull the base of transistor 36 up so as to turn it on and the same current will flow into diode 35 thereby forward biasing it. The $V_{BE}$ of transistor 36 will equal the $\theta$ of diode 35 so that whatever potential is present at terminal 13 will also be present at node 32. With the input low, node 32 will be held low and transistors 14 18 and 24 will be off. It can be seen that in order to turn transistors %4 18 and 24 on the input terminal 13 will have to rise to a threshold of 2$\theta$. This is 0.5$\theta$ above the threshold described for the input logic high state above. The difference, which is 0.5$\theta$, represents the hysteresis voltage for the gate circuit. At 300° K the value is about 400 millivolts.

Resistor 37 is included in the collector of transistor 36, which operates as an emitter follower, to suppress any parasitic oscillation tendencies therein and to limit the current in transistor 36.

SUMMARY OF THE INVENTION

It is an object of the invention to introduce hysteresis into the switching level of a high speed TTL logic inverter buffer circuit.

It is a further object of the invention to operate the biasing in a high speed TTL logic inverter buffer so that its switching level displays hysteresis and the signal propagation involves the same cascaded circuit stages for both logic signal polarities.

These and other objects are achieved in a circuit configured as follows. A phase splitter switching transistor drives a totem pole output stage in the well known TTL configuration. The emitter of the phase splitter switching transistor drives a Schottky pulldown element and the collector drives a Darlington-connected pullup element. The phase splitter switching transistor base is driven from an emitter-follower input stage that receives its input from the digital input signals supplied to the gate input.

The emitter follower input stage includes an impedance element coupled in series with its emitter so that the phase splitter switching transistor is driven through this impedance. The end of the impedance that is remote from the emitter follower input stage is connected to a current source and series switch combination. The switch is operated by a control circuit that can receive its sense from some other point in the inverter gate. In the preferred embodiment the sense is obtained from the collector of the phase splitter switching transistor and the control circuit comprises an emitter follower that has an output coupled to the base of the switch transistor. In this configuration when the gate output is high, the switch transistor is on and a constant current is passed through the impedance element coupled in series with the emitter of the emitter follower input stage. For this set of conditions the input logic will be low and the circuit threshold will be high due to the voltage drop across the series impedance. When the input logic is high the collector of the phase splitter switching transistor will be low and the switching transistor will be off. In this set of conditions the voltage drop across the series impedance is negligible and the circuit theshold is low. The difference in threshold values is the hysteresis voltage which is substantially equal to the constant current multiplied by the series impedance value.

BRIEF DESCRIPTION OF THE DRAWINGS

FIG. 1A is a simplified schematic diagram of a prior art hysteresis producing TTL logic inverter.

FIG. 1B is the symbol of the circuit of FIG. 1.

FIG. 2 is a greatly simplified schematic diagram of the circuit of the invention.

DESCRIPTION OF THE INVENTION

Figure 3:
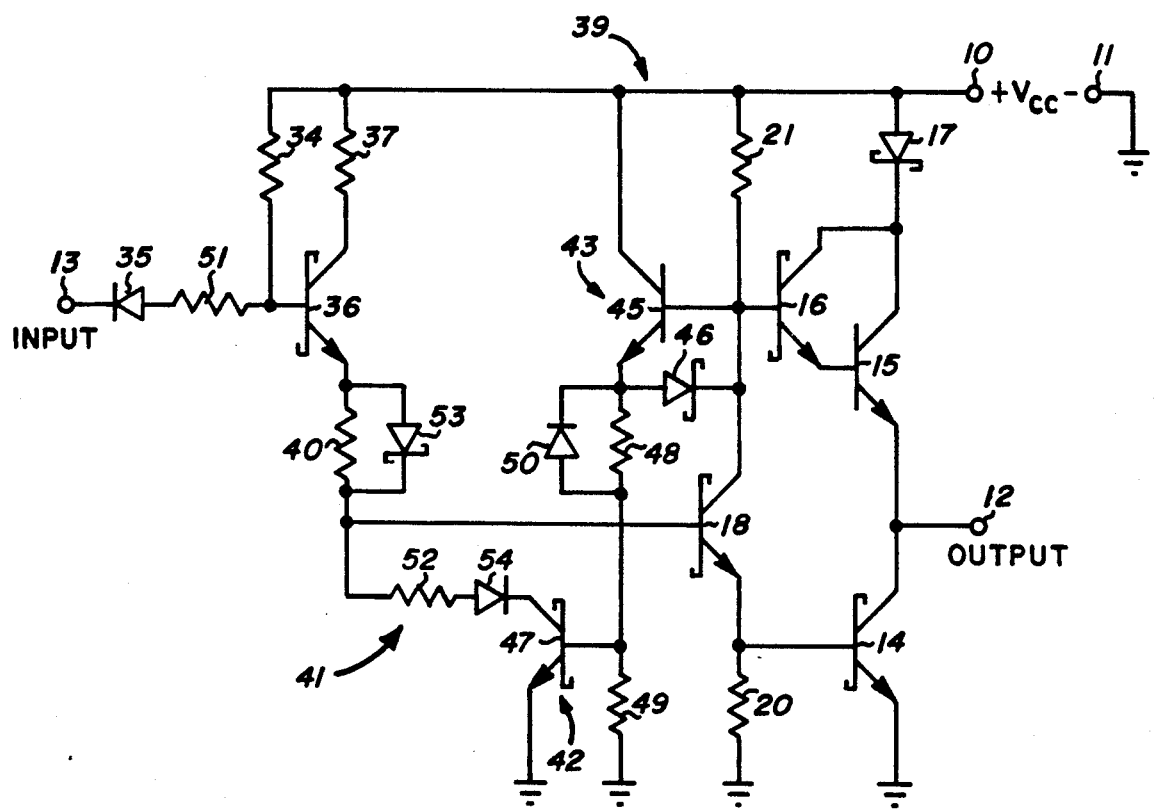
FIG. 3 is a partly simplified schematic diagram of the circuit of the invention.

FIG. 2 is a greatly simplified schematic diagram that sets forth the essential elements of the invention. Where the circuit 39 elements function in he same way as those of FIG. 1A the same numerals are used.

In accordance with the invention, resistor 40 is coupled in series with the emitter of emitter follower driver transistor 36 and a constant current source 41 coupled in series with a switch 42 that is operated by control circuitry 43. Resistor 40 ia of a relatively low value that will not develop a significant voltage drop due top the normal emitter current in transistor 36. Thus, with switch 42 in its open position, the input terminal clamp level will be about $2\theta$ above ground. When switch 42 ia closed the current in constant current source 41 will flow in transistor 36 and resistor 40. This can produce a significant voltage drop $V_{R40}$ across resistor 40. The clamp level for this condition is about $2\theta + V_{R40}$. Thus, the $V_{R40}$ is the hysteresis value of the circuit. The circuit operates as follows.

Control circuit 43 operates switch 42 and while it can receive its input sense from almost anywhere in the gate circuit, it is preferred that the control circuit 43 receives its sense from the collector of phase splitter switch transistor 18, as shown. Switch 42 closes when the digital input signal is low. For this condition the collector of transistor 18 is high. When switch 42 is closed the voltage drop across resistor 40 will be significant and the input threshold will be about $2\theta + V_{R40}$. Thus, the input will have to rise to this level to cause the buffer to switch. For the digital input high condition the collector of transistor 18 will be low and the control circuit 43 will cause switch 42 to open. For this state the input threshold will be about $2\theta$ and the input will have to fall to this level for the circuit to switch. Thus, the hysteresis value will be equal to the difference in thresholds or about $V_{R40}$.

FIG. 3 is a schematic diagram of a partly simplified complete buffer circuit 39 employing the invention. Where the elements are the same as those of FIGS. 1A and 2, the same numerals are used. It is to be understood that this circuit has been partly simplified to better show the invention. For example, the well-known "Miller Killer" circuit, along with the well-known transfer characteristic squaring circuit, have been omitted. Also, omitted are a number of protective and speed up diodes that are commonly used in TTL circuits. These elements are fully disclosed in the above-referenced databook.

Transistor 14 is the output terminal 12 pulldown element and it is driven directly from the emitter of phase splitter switch transistor 18. Resistor 20 returns the base of transistor 14 to ground and acts as the emitter load for transistor 18. Diode 17, along with Darlington-connected transistors 15 and 16, act as the output terminal 12 pullup elements. Resistor 21 returns the base of transistor 16 to the $+V_{CC}$ rail and acts as the collector load for phase splitter switch transistor 18.

Transistor 45 is the active portion of control 43 and operates as an emitter follower that is driven in parallel with the base of transistor 16. When transistor 18 is turned off by a logic input zero resistor 21 will pull the bases of transistors 16 and 45 up so as to turn them on. A logic input one will turn transistor 18 on so as to pull the bases of transistors 16 and 45 low and turn them off. Schottky diode 46 acts to quickly discharge the emitter node of transistor 45 in the logic one input state and thereby to rapidly turn switch transistor 47 off. This interrupts current source 41. Resistors 48 and 49 form a voltage divider load for the emitter of transistor 45 to drive switch transistor 47. Diode 50 is normally zero or reverse biased so that it acts as a capacitor that will speed up the switching of transistor 47.

In the input logo zero state the base node of transistor 18 will be below 20 so that transistors 14 and 18 will be off. Conduction in transistor 36 will tend to pull the base node of transistor 18 up and conduction in transistor 47 will act to pull this node down. Resistors 34 and 51 are selected to provide the desired current flow in transistor 36 and therefore the pullup action. The value of resistor 52 will determine the current flowing in transistor 47 and hence its pulldown action. These various components are selected so that for an input low condition the base of transistor 18 is sufficiently below 20 to ensure nonconception in transistors 14 and 18. It can be seen that the conduction in transistors 36 and 47 causes a current to flow in resistor 40. This produces a voltage drop $V_{R40}$ that ia the hysteresis voltage. Its value is typically about 400 mv at 300° K. This means that the circuit conduction threshold at the emitter of transistor 36 is $2\theta + 400$ millivolts.

In the input logic one transition stage, conduction in transistor 36 will pull the bases of transistor 14 and 18 up so as to turn them on. Resistor 37 limits the current flowing in transistor 36 to a desired value. For this state diode 53 will be forward biased thus clamping the emitter of transistor 36 at $2\theta + V_{53}$ where $V_{53}$ is the forward conduction voltage drop across Schottky diode 53. This action makes sure that the above-mentioned threshold is exceeded at the turn on transistion.

When the logic input is switching from low to high, Schottky diode 53 will quickly couple the transient from the emitter of transistor 36 to the base of transistor 18 and accelerate the turn on action in the phase splitter switch transistor.

Diode 54, which is forward biased when transistor 47 is on, is optional and acts as a level shifter to assist in determining the conduction of current source 41. It is present to improve the circuit performance over temperature.

EXAMPLE

The circuit of FIG. 3 was constructed in a silicon monolithic IC form using the Planar II process which employs high performance oxide isolated Schottky diode clamped transistors. The following component values were employed.

| COMPONENT | VALUE IN OHMS |
|---|---|
| Resistor 20 | 17K |
| Resistor 21 | 9.9K |
| Resistor 34 | 6K |
| Resistor 37 | 5.2K |
| Resistor 40 | 719 |
| Resistor 48 | 5.2K |
| Resistor 49 | 7.9K |
| Resistor 51 | 1094 |
| Resistor 52 | 2079 |

The circuit was operated using a 5-volt supply and its logic input and outputs performed in accordance with accepted TTL values. The hysteresis voltage was about 400 millivolts. The circuit had a propagation delay of about 2.7 nS for the output H to L transition and about 2.3 nS for the output L to H transition.

The invention has been described and a working example detailed. When a person skilled in the art reads the foregoing description, alternatives and equivalents, within the spirit and intent of the invention, will be apparent. Accordingly, it is intended that the scope of the invention be limited only by the following claims.

I claim:

1. A high speed TTL inverter gate circuit having hysteresis in its switching operation, said circuit comprising:
   a phase splitter switching transistor having an input base and paraphase outputs coupled to drive an output stage which provides a digital signal output;
   an emitter follower transistor input stage having a base coupled to receive digital input signals and an emitter coupled to drive said phase splitter switching transistor base;
   an impedance element coupled in series with said emitter follower transistor emitter;
   a current source for providing a controlled current; and
   switch means for passing said controlled current through said impedance element when said gate output is high and for removing said controlled current from said impedance element when said gate output is low whereby said gate has a higher threshold when said gate output us high and a lower threshold when said gate output is low.

2. The high speed TTL inverter gate circuit of claim 1 wherein said impedance element is a first resistor.

3. The high speed TTL inverter gate circuit of claim 2 wherein a first Schottky diode is connected in parallel with said first resistor.

4. The high speed TTL inverter gate circuit of claim 3 wherein said switch means is a Schottky transistor.

5. The high speed TTL inverter gate circuit of claim 4 wherein said current source comprises a second resistor and a forward biased PN junction diode coupled in series with said Schottky switch transistor.

6. The high speed TTL inverter gale circuit of claim 5 further including a forward biased PN junction diode coupled in series with said second resistor.

7. The high speed TTL inverter gate circuit of claim 5 wherein said Schottky switch transistor has its base driven from control means operated by the digital signals being amplified.

8. The high speed TTL inverter gate circuit of claim 7 wherein said control means comprise an emitter follower control transistor having an input coupled to the collector of said phase splitter switching transistor and an output coupled to said base of said Schottky switch transistor.

9. The high speed TTL inverter gate circuit of claim 8 wherein a second Schottky diode is connected between the input and output terminals of said emitter follower control transistor whereby the emitter node of said emitter follower control transistor is rapidly discharged when said phase splitter switching transistor is turned on.

* * * * *